(12) United States Patent
Zhou et al.

(10) Patent No.: US 11,081,587 B2
(45) Date of Patent: Aug. 3, 2021

(54) THIN FILM TRANSISTOR AND METHOD FOR MANUFACTURING THE SAME, DISPLAY PANEL AND METHOD FOR MANUFACTURING THE SAME

(71) Applicants: Chongqing BOE Optoelectronics Technology Co., Ltd., Chongqing (CN); BOE TECHNOLOGY GROUP CO., LTD., Beijing (CN)

(72) Inventors: Hongru Zhou, Beijing (CN); Kai Wang, Beijing (CN); Kunkun Gao, Beijing (CN); Xiaonan Dong, Beijing (CN); Zhaojun Wang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/502,619

(22) Filed: Jul. 3, 2019

(65) Prior Publication Data
US 2020/0035835 A1   Jan. 30, 2020

(30) Foreign Application Priority Data
Jul. 27, 2018   (CN) .......................... 201810847931.3

(51) Int. Cl.
*H01L 29/786* (2006.01)
*H01L 29/417* (2006.01)
(Continued)

(52) U.S. Cl.
CPC .. *H01L 29/78606* (2013.01); *H01L 29/41733* (2013.01); *H01L 29/42384* (2013.01); *H01L 29/66742* (2013.01); *H01L 29/78696* (2013.01)

(58) Field of Classification Search
CPC .............. H01L 27/124; H01L 27/3276; H01L 29/41733; H01L 29/42384; H01L 27/1288;
(Continued)

(56) References Cited

U.S. PATENT DOCUMENTS

| 8,748,880 B2 * | 6/2014 | Yamazaki | ........... H01L 27/1225 257/43 |
| 2013/0207101 A1 * | 8/2013 | Yamazaki | ......... H01L 29/41733 257/43 |

(Continued)

FOREIGN PATENT DOCUMENTS

| CN | 103413834 A | 11/2013 |
| CN | 104779272 A | 7/2015 |
| CN | 105789120 A | 7/2016 |

OTHER PUBLICATIONS

First Office Action dated Jan. 20, 2021 corresponding to Chinese Application No. 201810847931.3.

*Primary Examiner* — Jonathan Han
(74) *Attorney, Agent, or Firm* — Nath, Goldberg & Meyer; Joshua B. Goldberg

(57) ABSTRACT

There is provided a thin film transistor including: a substrate; a gate electrode and a first electrode in a single layer on the substrate; an active layer above the first electrode, an orthographic projection of the active layer on the substrate at least partially covers an orthographic projection of the first electrode on the substrate; a first insulation layer covering the gate electrode, the first electrode, the active layer, a portion of the substrate exposed between the gate
(Continued)

electrode and the active layer, and another portion of the substrate exposed between the gate electrode and the first electrode; and a second electrode above the first insulation layer, an orthographic projection of the second electrode on the substrate at least partially covers the orthographic projection of the active layer on the substrate, and the second electrode is connected to the active layer through a via-hole in the first insulation layer.

15 Claims, 7 Drawing Sheets

(51) Int. Cl.
  *H01L 29/423* (2006.01)
  *H01L 29/66* (2006.01)
(58) Field of Classification Search
  CPC ..... H01L 51/0508–057; H01L 27/3274; H01L 2924/1307; G02F 1/136286; G02F 1/1368; G02F 2201/121; G02F 2201/123
  USPC .................. 257/40, 43, 72; 438/104, 151
  See application file for complete search history.

(56) References Cited

U.S. PATENT DOCUMENTS

| | | | |
|---|---|---|---|
| 2015/0076495 A1* | 3/2015 | Miyairi | H01L 29/78642 257/43 |
| 2016/0163864 A1 | 6/2016 | Lin et al. | |
| 2016/0300899 A1* | 10/2016 | Zhang | H01L 29/42384 |
| 2017/0199410 A1* | 7/2017 | Jiang | G02F 1/136286 |

* cited by examiner

THIN FILM TRANSISTOR AND METHOD FOR MANUFACTURING THE SAME, DISPLAY PANEL AND METHOD FOR MANUFACTURING THE SAME

CROSS-REFERENCE TO RELATED APPLICATIONS

The present application claims the priority of Chinese Patent Application No. 201810847931.3, filed on Jul. 27, 2018, the contents of which are incorporated herein in their entirety by reference.

TECHNICAL FIELD

The present disclosure relates to the field of display technology, and in particular to a thin film transistor and a method for manufacturing the thin film transistor, a display panel and a method for manufacturing the display panel.

BACKGROUND

An array substrate of a display panel generally includes a plurality of pixel regions, each of the pixel regions is provided with a thin film transistor (TFT) for controlling displaying of a pixel.

In related technology, a drain electrode and a source electrode of a thin film transistor are provided in a single layer, a length of a channel of the thin film transistor equals to a distance between the drain electrode and the source electrode. However, since an exposure equipment for manufacturing the thin film transistor generally has a low accuracy, it is difficult to reduce the distance between the drain electrode and the source electrode of the thin film transistor, thereby the length of the channel of the thin film transistor cannot be reduced, correspondingly, a portion of an active layer for the channel of the thin film transistor has a relatively large resistance, which is detrimental to carrier transport. Therefore, the thin film transistor of related technology has a poor driving ability.

SUMMARY

An embodiment of the present disclosure provides a thin film transistor, including: a substrate; a gate electrode and a first electrode provided in a single layer on the substrate; an active layer formed above the first electrode, an orthographic projection of the active layer on the substrate at least partially covers an orthographic projection of the first electrode on the substrate; a first insulation layer covering the gate electrode, the first electrode, the active layer, a portion of the substrate exposed between the gate electrode and the active layer, and another portion of the substrate exposed between the gate electrode and the first electrode; and a second electrode formed above the first insulation layer, an orthographic projection of the second electrode on the substrate at least partially covers the orthographic projection of the active layer on the substrate, and the second electrode is connected to the active layer through a via-hole in the first insulation layer.

In some implementations, a thickness of the first electrode in a direction perpendicular to the substrate is less than a thickness of the gate electrode in the direction perpendicular to the substrate, and a difference between the thickness of the gate electrode and the thickness of the first electrode is less than a first threshold.

In some implementations, the gate electrode includes a first metal film layer and a second metal film layer stacked together, the first metal film layer is provided closer to the substrate than the second metal film layer, the second metal film layer is provide at a side of the first metal film layer away from the substrate, and the first electrode includes the first metal film layer.

In some implementations, the orthographic projection of the second electrode on the substrate at least partially covers the orthographic projection of the first electrode on the substrate.

In some implementations, the gate electrode has a ring structure, and at least a portion of the first electrode is located in a region surrounded by the ring structure.

In some implementations, the ring structure has an opening, the first electrode includes a first part and a second part, the first part of the first electrode is located in the region surrounded by the ring structure, the second part is connected to the first part and extends to outside of the ring structure through the opening, and the orthographic projection of the active layer on the substrate covers an orthographic projection of the first part of the first electrode on the substrate.

An embodiment of the present disclosure further provides a display panel including a pixel structure, and the pixel structure includes the thin film transistor as above.

In some implementations, the first electrode is a drain electrode, the second electrode is a source electrode, and the pixel structure further includes: a second insulation layer covering the first insulation layer and the second electrode, an orthographic projection of the second insulation layer on the substrate covers an orthographic projection of the second part of the first electrode on the substrate; and a pixel electrode layer covering the second insulation layer, the pixel electrode layer is connected to the second part of the first electrode through a via-hole in the second insulation layer.

In some implementations, the first electrode is a source electrode, the second electrode is a drain electrode, and the pixel structure further includes: a second insulation layer covering the first insulation layer and the second electrode, an orthographic projection of the second insulation layer on the substrate covers an orthographic projection of the second electrode on the substrate; and a pixel electrode layer covering the second insulation layer, the second insulation layer is connected to the second electrode through a via-hole in the second insulation layer.

In some implementations, the display panel includes a plurality of thin film transistors arranged in a single column, the first electrode of each of the thin film transistors is a source electrode, the second electrode of each of the thin film transistors is the drain electrode, and the display panel further includes: a source electrode connection layer for connecting source electrodes of the thin film transistors in the single column, and the source electrode connection layer is provided in a layer the same as that in which the second electrode of each of the thin film transistors or the pixel electrode layer is provided.

An embodiment of the present disclosure further provides a method for manufacturing a thin film transistor, including: providing a substrate; forming a gate electrode and a first electrode in a single layer on the substrate by a patterning process; forming an active layer above the first electrode, an orthographic projection of the active layer on the substrate at least partially covers an orthographic projection of the first electrode on the substrate; forming a first insulation layer covering the gate electrode, the first electrode, the active layer, a portion of the substrate exposed between the gate electrode and the active layer, and another portion of the substrate exposed between the gate electrode and the first electrode; and forming a second electrode on the first insulation layer, an orthographic projection of the second electrode on the substrate at least partially covers the orthographic projection of the active layer on the substrate, and the second electrode is connected to the active layer through a via-hole in the first insulation layer.

In some implementations, forming the gate electrode and the first electrode in the single layer on the substrate by the patterning process includes: forming a first metal film layer and a second metal film layer on the substrate, the first metal film layer is formed closer to the substrate than the second metal film layer, the second metal film layer is formed at a side of the first metal film layer away from the substrate; etching the metal film layers by an etching liquid capable of etching both the first metal film layer and the second metal film layer to form the gate electrode and a first electrode pattern; and etching the first electrode pattern by an etching liquid capable of etching the second metal film layer to form the first electrode.

An embodiment of the present disclosure further provides a method for manufacturing a display panel, including the method for forming the thin film transistor as above.

In some implementations, the first electrode is a drain electrode, the second electrode is a source electrode, and the method for manufacturing the display panel further includes: forming a second insulation layer on the first insulation layer and the second electrode, an orthographic projection of the second insulation layer on the substrate covers an orthographic projection of the second part of the first electrode on the substrate; and forming a pixel electrode layer on the second insulation layer, the pixel electrode layer is connected to the second part of the first electrode through a via-hole in the second insulation layer.

In some implementations, the first electrode is a source electrode, the second electrode is a drain electrode, and the method for manufacturing the display panel further includes: forming a second insulation layer on the first insulation layer and the second electrode, an orthographic projection of the second insulation layer on the substrate covers the orthographic projection of the second electrode on the substrate; and forming a pixel electrode layer on the second insulation layer, and the pixel electrode layer is connected to the second electrode through a via-hole in the second insulation layer.

In some implementations, the display panel further includes a plurality of thin film transistors arranged in a single column, the first electrode of each of the thin film transistors is a source electrode, the second electrode of each of the thin film transistors is a drain electrode, and the method for manufacturing the display panel further includes: forming a source electrode connection layer in a layer the same as that in which the second electrode of each of the thin film transistors or the pixel electrode layer is provided, source electrodes of the thin film transistors in the single column are connected together through the source electrode connection layer.

DESCRIPTION OF EMBODIMENTS

In order to make a person skilled in the art understand technical solutions, features and advantages of the present disclosure easily, the technical solutions of the present disclosure will be described in detail below in conjunction with accompanying drawings and specific embodiments.

An embodiment of the present disclosure provides a thin film transistor including a substrate, a gate electrode, a first electrode, an active layer, a first insulation layer and a second electrode. The first electrode is a drain electrode, and the second electrode is a source electrode. The gate electrode and the first electrode may be provided in a single layer on the substrate. The active layer may be formed above the first electrode, and an orthographic projection of the active layer on the substrate at least partially covers an orthographic projection of the first electrode on the substrate. The first insulation layer may cover the gate electrode, the first electrode, the active layer, a portion of the substrate exposed between the gate electrode and the active layer and another portion of the substrate exposed between the gate electrode and the first electrode. The second electrode may be formed on the first insulation layer, an orthographic projection of the second electrode on the substrate at least partially covers the orthographic projection of the active layer on the substrate, and the second electrode may be connected to the active layer through a via-hole in the first insulation layer.

Figure 1:
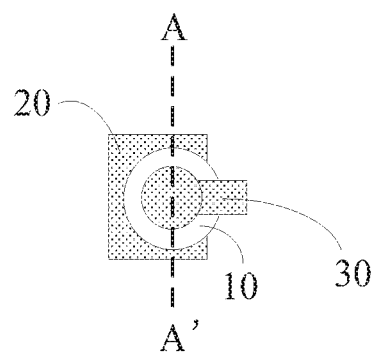
FIG. 1 shows a top view of a structure in which a gate electrode and a drain electrode are provided in a single layer on a substrate in an embodiment of the present disclosure.

FIG. 1 shows a top view of a structure in which a gate electrode and a drain electrode are provided in a single layer on a substrate in the embodiment. As shown in FIG. 1, a gate electrode 20 and a drain electrode 30 may be provided in a single layer on a substrate 10, the gate electrode 20 may have a ring structure, and at least a portion of the drain electrode 30 is located in a region surrounded by the ring structure of the gate electrode 20.

In some implementations, the ring structure of the gate electrode 20 may have an opening, the drain electrode 30 may include a first part and a second part, the first part of the drain electrode 30 may be located in the region surrounded by the ring structure of the gate electrode 20, referring to FIG. 1, the first part of the drain electrode 30 may be a circular part as shown in FIG. 1, and in practical applications, a top view of the first part of the drain electrode 30 may also be elliptical. The second part of the drain electrode 30 may be connected to the first part of the drain electrode 30 and extend to outside of the ring structure of the gate electrode 20 through the opening of the ring structure of the gate electrode 20, referring to FIG. 1, the second part of the drain electrode 30 may be a protruding part connected to the first part of the drain electrode 30 as shown in FIG. 1, and the second part of the drain electrode 30 may extend to a pixel display region for connecting to a pixel electrode layer subsequently. An outer contour of the ring structure of the gate electrode 20 may be square, and an inner contour of the ring structure of the gate electrode 20 may be circular, as shown in FIG. 1, and in practical applications, the outer contour and the inner contour of the ring structure of the gate electrode 20 may also have other shapes, for example, in a case where the top view of the first part of the drain electrode 30 is elliptical, the inner contour of the ring structure of the gate electrode 20 may be correspondingly adjusted to be elliptical, a shape of the region surrounded by the ring structure of the gate electrode 20 and a shape of the top view of the first part of the drain electrode 30 are not limited in the embodiment.

Figure 2:
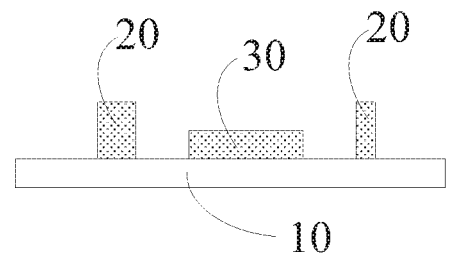
FIG. 2 shows a sectional view of the structure in which the gate electrode and the drain electrode are provided in the single layer on the substrate in the embodiment of the present disclosure.

FIG. 2 shows a sectional view of the structure in which the gate electrode and the drain electrode are provided in the single layer on the substrate in the embodiment, which is taken along line AA' shown in FIG. 1. As shown in FIG. 2, in a practical manufacturing, a thickness of the drain electrode 30 in a stacking direction (i.e., in a direction perpendicular to the substrate 10) may be less than a thickness of the gate electrode 20 in the stacking direction, and a difference between the thickness of the gate electrode 20 and the thickness of the drain electrode 30 may be less than a first threshold, the first threshold may be a thickness of a single metal film layer. Since other film layers such as an active layer would be formed on the drain electrode 30 subsequently, a subsequent entire thickness of film layers at the drain electrode 30 would be increased, thereby the subsequent entire thickness of film layers at the drain electrode 30 generally would be greater than the thickness of the gate electrode 20, and in a case where the thickness of the drain electrode 30 is less than the thickness of the gate electrode 20, a difference between the subsequent entire thickness of film layers at the drain electrode 30 and the thickness of the gate electrode 20 can be reduced, an uniformity of thickness of an array substrate including the thin film transistor of the embodiment of the present disclosure can be improved, avoiding a problem of rubbing mura during displaying of a display panel including the array substrate.

In practical applications, the gate electrode 20 may include a first metal film layer and a second metal film layer stacked together, the first metal film layer is provided closer to the substrate 10 than the second metal film layer, the second metal film layer is provided at a side of the first metal film layer away from the substrate 10, the drain electrode 30 may include the first metal film layer, that is, the gate electrode 20 and the drain electrode 30 may include different metal film layers to achieve the difference between the thickness of the gate electrode 20 and the thickness of the drain electrode 30, the difference between the thickness of the gate electrode 20 and the thickness of the drain electrode 30 may equal to a thickness of the second metal film layer. In practical applications, the first metal film layer may be an aluminum film layer, and the second metal film layer may be a copper film layer.

In a case where the gate electrode 20 and the drain electrode 30 are metal film layers, the metal film layers can be used as a base for forming the active layer subsequently, since the metal film layers have a good uniformity, it is helpful to optimize a grain size of the active layer, avoiding a formation of defects, and a film quality of the active layer can be improved.

Figure 3:
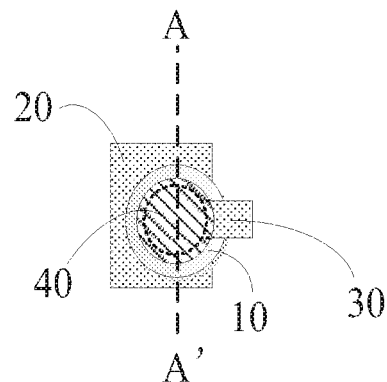
FIG. 3 shows a top view of a structure in which an active layer is formed above the drain electrode in an embodiment of the present disclosure.
Figure 4:
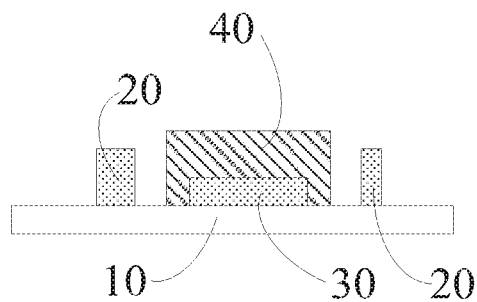
FIG. 4 shows a sectional view of the structure in which the active layer is formed above the drain electrode in the embodiment of the present disclosure.

FIG. 3 shows a top view of a structure in which an active layer is formed above the drain electrode in an embodiment of the present disclosure. FIG. 4 shows a sectional view of the structure in which the active layer is formed above the drain electrode in the embodiment, which is taken along line AA' shown in FIG. 3. As shown in FIG. 3, an orthographic projection of an active layer 40 on the substrate 10 covers an orthographic projection of the first part of the drain electrode 30 on the substrate 10. In some implementations, the active layer 40 fully covers the first part of the drain electrode 30, and further covers a portion of the substrate 10 exposed between the ring structure of the gate electrode 20 and the first part of the drain electrode 30, as shown in FIG. 4, the active layer 40 covers an upper surface (i.e., a surface away from the substrate 10) of the first part of the drain electrode 30, and further covers side surface (i.e., a surface intersecting the upper surface) of the first part of the drain electrode 30, in such way, a contact area between the active layer 40 and the drain electrode 30 is increased, a potential drop between the drain electrode 30 and the active layer 40 is reduced, which is helpful to carrier transport in the active layer 40.

In practical applications, the active layer 40 may include semiconductor material such as amorphous silicon, polycrystalline silicon and metal oxide (e.g., indium gallium zinc oxide, IGZO), which is not limited in the embodiment.

Figure 5:
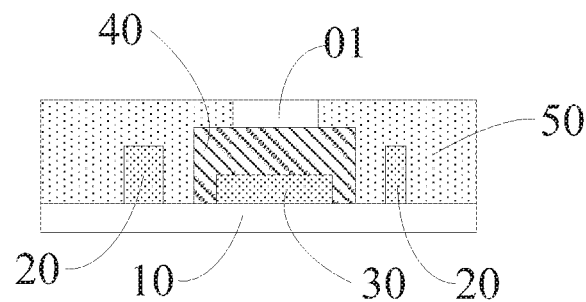
FIG. 5 shows a sectional view of a structure in which a first insulation layer is formed in an embodiment of the present disclosure.

FIG. 5 shows a sectional view of a structure in which a first insulation layer is formed in the embodiment, which is also taken along line AA'. As shown in FIG. 5, a first insulation layer 50 may cover the gate electrode 20, the drain electrode 30, the active layer 40, a portion of the substrate 10 exposed between the gate electrode 20 and the active layer 40, and another portion of the substrate 10 exposed between the gate electrode 20 and the second part of the drain electrode 30. Since the active layer 40 would be connected to a source electrode to be formed subsequently, a first via-hole 01 may be provided in a region of the first insulation layer 50 corresponding to the active layer 40, so that the source electrode can be connected to the active layer 40 through the first via-hole 01 in the first insulation layer 50.

Figure 6:
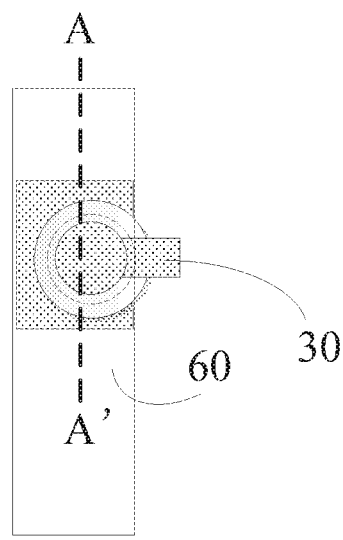
FIG. 6 shows a top view of a thin film transistor in which a source electrode is formed on the first insulation layer in an embodiment of the present disclosure.
Figure 7:
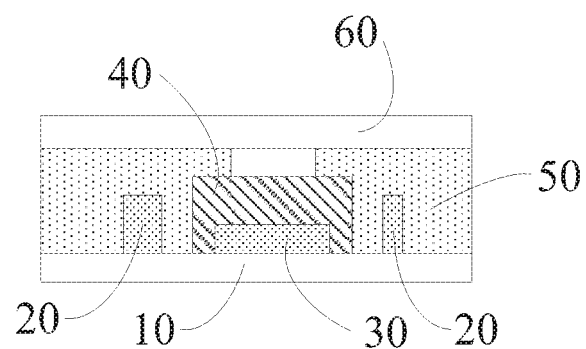
FIG. 7 shows a sectional view of the thin film transistor in which the source electrode is formed on the first insulation layer in the embodiment of the present disclosure.

FIG. 6 shows a top view of a thin film transistor in which a source electrode is formed on the first insulation layer in the embodiment. FIG. 7 shows a sectional view of the thin film transistor in which the source electrode is formed on the first insulation layer in the embodiment, which is taken along line AA' shown in FIG. 6. As shown in FIG. 6, an orthographic projection of a source electrode 60 on the substrate 10 at least partially covers the orthographic projection of the active layer 40 on the substrate 10, referring to FIG. 7, the source electrode 60 may be connected to the active layer 40 through the first via-hole 01 in the first insulation layer 50. In practical applications, the source electrode 60 of each thin film transistor covers a portion of the active layer 40 of the thin film transistor, and may further extend to other thin film transistors in a same column as that of the thin film transistor, that is, thin film transistors in a single column may share one source electrode 60, thus the source electrode 60 may be used as a data line for driving the thin film transistors in the single column.

In practical applications, an orthographic projection of the source electrode 60 on the substrate 10 may at least partially cover the orthographic projection of the drain electrode 30 on the substrate 10, that is, the source electrode 60 and the drain electrode 30 may have facing areas in a stacking direction in which the source electrode 60 and the drain electrode 30 are stacked, thus a length of a channel between the source electrode 60 and the drain electrode 30 may be a thickness of the active layer 40 between the source electrode 60 and the drain electrode 30 in the stacking direction. Certainly, in practical applications, the orthographic projection of the source electrode 60 on the substrate 10 and the orthographic projection of the drain electrode 30 on the substrate 10 may have no overlapped portions, that is, the source electrode 60 and the drain electrode 30 may have no facing areas in the stacking direction, with respect to the thin film transistor in which the source electrode 60 and the drain electrode 30 have no facing areas in the stacking direction, the length of the channel between the source electrode 60 and the drain electrode 30 is only slightly greater than that of the thin film transistor in which the source electrode 60 and the drain electrode 30 have facing areas in the stacking direction, but is still less than that of the thin film transistor of related technology in which the source electrode and the drain electrode are provided in a single layer.

It should be noted that, in order to illustrate a positional relationship between the source electrode 60 and other structures clearly, the first insulation layer 50 is not shown in FIG. 6, and the present disclosure is not limited by the structure shown in FIG. 6.

A manufacturing of the thin film transistor of the embodiment is completed after the source electrode 60 is formed. In a traditional thin film transistor, a drain electrode and a source electrode are formed in a single layer, and since an accuracy of an exposure equipment is relatively low, a distance between the source electrode and the drain electrode generally equals to about 3 µm, and it is difficult to reduce the distance between the source electrode and the drain electrode, by contrast, in the thin film transistor of the embodiment, the drain electrode and the source electrode may be located in different layers, and the active layer may be located between the drain electrode and the source electrode, correspondingly, the length of the channel of the thin film transistor is the thickness of the active layer between the source electrode and the drain electrode, since a precision for controlling the thickness of the active layer is high in technology, the thickness of the active layer may be controlled below 1 µm, in the thin film transistor of the embodiment, the length of the channel is reduced significantly, an impedance during carrier transporting can be reduced, and a driving ability of the thin film transistor is improved.

Further, in the thin film transistor of the embodiment, the gate electrode has the ring structure, a portion of the drain electrode may be located in the region surrounded by the ring structure of the gate electrode, and the active layer may cover the side surface of the drain electrode along the region surrounded by the ring structure of the gate electrode, thereby the contact area between the active layer and the drain electrode is increased, the potential drop between the drain electrode and the active layer is reduced, which is helpful to carrier transport in the active layer. In addition, the ring structure of the gate electrode is helpful to a directional drive of excited electrons in the active layer under an influence of a magnetic field, thereby a driving ability of the gate electrode can be improved and a density of carriers in the active layer can be improved.

Furthermore, in the thin film transistor of the embodiment, the active layer is sandwiched between the source electrode and the drain electrode, it is avoided to expose the active layer in ambient light, thereby a shift of threshold voltage of the thin film transistor caused by a light-induced degradation of the active layer can be avoided, and a stability of the active layer is correspondingly improved.

Figure 8:
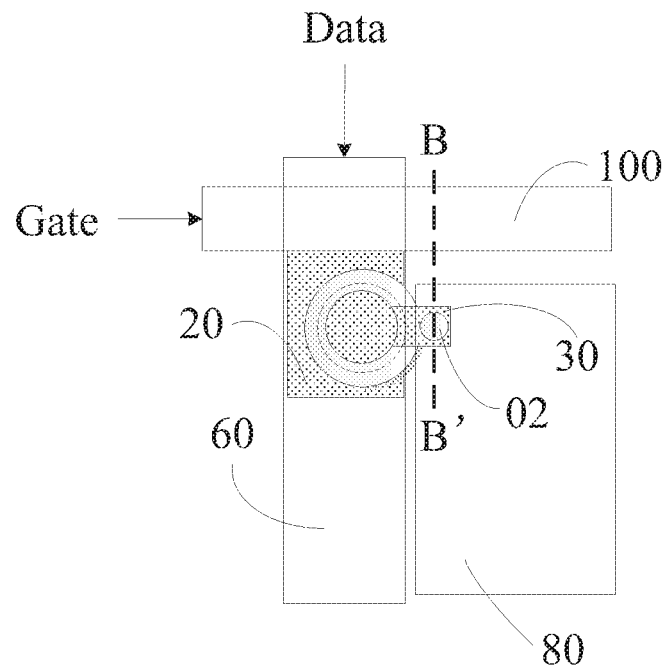
FIG. 8 shows a top view of a pixel structure in which a second insulation layer and a pixel electrode layer are formed on the thin film transistor in an embodiment of the present disclosure.
Figure 9:
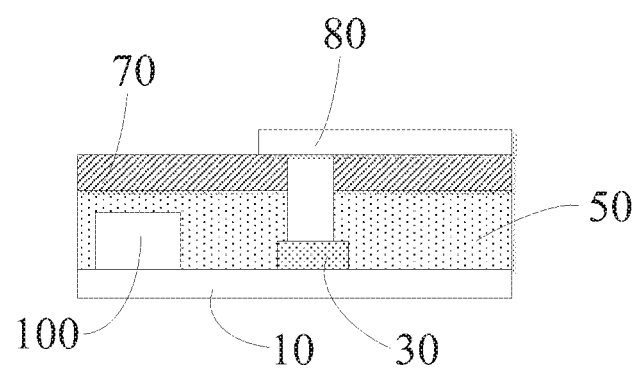
FIG. 9 shows a sectional view of the pixel structure in which the second insulation layer and the pixel electrode layer are formed on the thin film transistor in the embodiment of the present disclosure.

Moreover, a second insulation layer and a pixel electrode layer may be provided above the thin film transistor of the embodiment to form a pixel structure. FIG. 8 shows a top view of a pixel structure in which a second insulation layer and a pixel electrode layer are formed on the thin film transistor in the embodiment. FIG. 9 shows a sectional view of the pixel structure in which the second insulation layer and the pixel electrode layer are formed on the thin film transistor in the embodiment, which is taken along line BB' shown in FIG. 8. As shown in FIG. 9, a second insulation layer 70 may cover the first insulation layer 50 and the source electrode 60, and an orthographic projection of the second insulation layer 70 on the substrate 10 may cover an orthographic projection of the second part of the drain electrode 30 on the substrate 10. As shown in FIG. 8, a second via-hole 02 is provided at a position of the second insulation layer 70 corresponding to the second part of the drain electrode 30. After forming the second insulation layer 70, a pixel electrode layer 80 may further be formed, the pixel electrode layer 80 covers the second insulation layer 70, and in some implementations, the pixel electrode layer 80 may cover a portion of the second insulation layer 70 corresponding to a pixel display region, that is, the pixel electrode layer 80 is formed above the portion of the second insulation layer 70 corresponding to the pixel display region, and the pixel electrode layer 80 may be connected to the second part of the drain electrode 30 through the second via-hole 02, as shown in FIG. 9.

Figure 10:
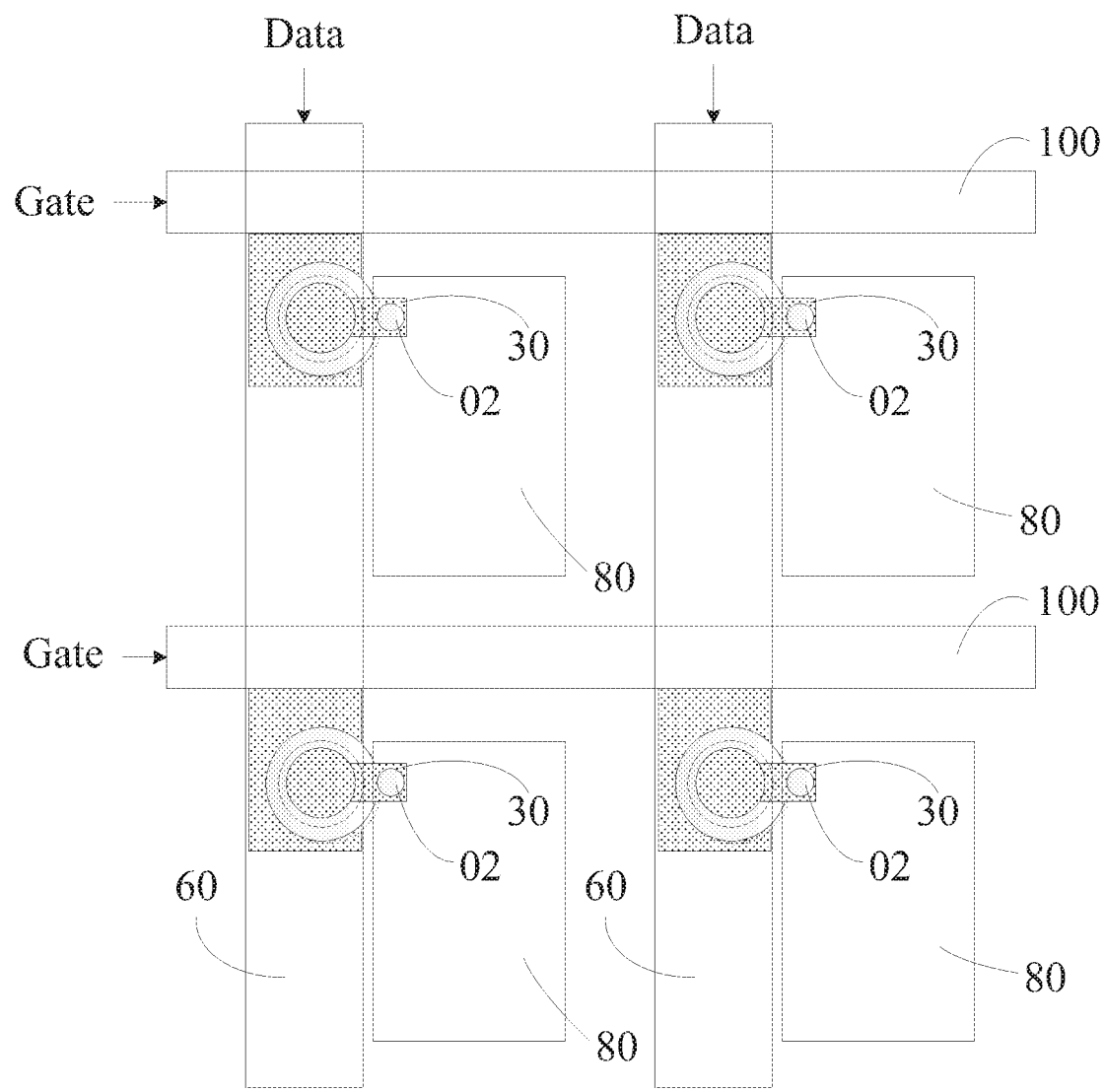
FIG. 10 shows a diagram of connections between a plurality of thin film transistors and a gate line, a data line in an embodiment of the present disclosure.

In addition, as shown in FIG. 8, in a display panel including the thin film transistor of the embodiment, a gate line 100 may be connected to the gate electrode 20 of the thin film transistor, and during displaying, a gate scanning signal Gate may be input to the gate line 100 to control on/off of the thin film transistor. The source electrode 60 of each thin film transistor may extend to other thin film transistors in a same column as that of the thin film transistor, so that the source electrode 60 may be used as a data line of the display panel, and during displaying, a data signal Data may be input to the source electrode 60 to control displaying of a pixel. Specifically, FIG. 10 shows a diagram of connections between a plurality of thin film transistors and a gate line, a data line in the embodiment. As shown in FIG. 10, each gate line 100 may extend to thin film transistors in a single row, be connected to the gate electrode 20 of each of the thin film transistors in the single row and input the gate scanning signal Gate to the gate electrode 20 of each of the thin film transistors in the single row, to drive the thin film transistors in an entire row. Additionally, as shown in FIG. 10, the source electrode 60 of each thin film transistor may extend to thin film transistors in a same column as that of the thin film transistor, to be used as the data line for driving the thin film transistors in an entire column, and during displaying, the data signal Data may be input to the source electrode 60 to drive pixels in column and control displaying of the pixels. It should be noted that, FIG. 10 only shows an example of a connection relationship between four thin film transistors and the gate lines, the data lines, but the present disclosure is not limited thereto.

It should be noted that, in order to illustrate a positional relationship between the pixel electrode layer 80 and other structures clearly, the second insulation layer 70 is not shown in FIG. 8, and the present disclosure is not limited by the structure shown in FIG. 8.

The thin film transistor of the embodiment may include a substrate, a gate electrode and a first electrode provided in a single layer on the substrate, an active layer formed above the first electrode, a first insulation layer and a second electrode formed on the first insulation layer, an orthographic projection of the active layer on the substrate at least partially covers an orthographic projection of the first electrode on the substrate, the first insulation layer covers the gate electrode, the first electrode, the active layer, a portion of the substrate exposed between the gate electrode and the active layer and another portion of the substrate exposed between the gate electrode and the first electrode, an orthographic projection of the second electrode on the substrate at least partially covers the orthographic projection of the active layer on the substrate, and the second electrode is connected to the active layer through a via-hole in the first insulation layer. In the thin film transistor of the embodiment, the first electrode and the second electrode may be located in different layers, and the active layer may be located between the first electrode and the second electrode, correspondingly, the length of the channel of the thin film transistor equals to the thickness of the active layer between the first electrode and the second electrode, since a precision for controlling the thickness of the active layer is high in technology, the length of the channel of the thin film transistor can be reduced, thereby an impedance during carrier transporting is reduced, and a driving ability of the thin film transistor is improved.

An embodiment of the present disclosure further provides a thin film transistor including a substrate, a gate electrode, a first electrode, an active layer, a first insulation layer and a second electrode. The first electrode is a source electrode, and the second electrode is a drain electrode. The gate electrode and the first electrode may be provided in a single layer on the substrate. The active layer may be formed above the first electrode, and an orthographic projection of the active layer on the substrate at least partially covers an orthographic projection of the first electrode on the substrate. The first insulation layer may cover the gate electrode, the first electrode, the active layer, a portion of the substrate exposed between the gate electrode and the active layer and another portion of the substrate exposed between the gate electrode and the first electrode. The second electrode may be formed on the first insulation layer, an orthographic projection of the second electrode on the substrate at least partially covers the orthographic projection of the active layer on the substrate, and the second electrode may be connected to the active layer through a via-hole in the first insulation layer.

Figure 11:
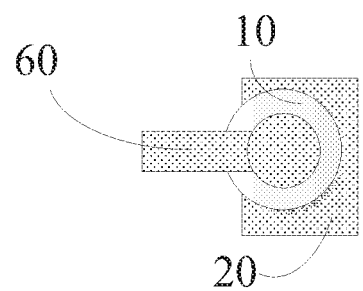
FIG. 11 shows a top view of a structure in which a gate electrode and a source electrode are provided in a single layer on a substrate in an embodiment of the present disclosure.

Different from the embodiment shown in FIGS. 1 through 10, in the thin film transistor of this embodiment, the first electrode is the source electrode, and the second electrode is the drain electrode. FIG. 11 shows a top view of a structure in which the gate electrode and the source electrode are provided in a single layer on the substrate in the embodiment. As shown in FIG. 11, the gate electrode 20 and the source electrode 60 may be provided in a single layer on the substrate 10, the gate electrode 20 may have a ring structure, and at least a portion of the source electrode 60 is located in the region surrounded by the ring structure.

In some implementations, the ring structure of the gate electrode 20 may have an opening, the source electrode 60 may include a first part and a second part, and the first part of the source electrode 60 may be located in the region surrounded by the ring structure of the gate electrode 20, as shown in FIG. 11, the first part of the source electrode 60 may be a circular part as shown in FIG. 11, and in practical applications, a top view of the first part of the source electrode 60 may also be elliptical. The second part of the source electrode 60 may be connected to the first part of the source electrode 60 and extend to outside of the ring structure of the gate electrode 20 through the opening of the ring structure of the gate electrode 20, referring to FIG. 11, the second part of the source electrode 60 may be a protruding part connected to the first part of the source electrode 60 as shown in FIG. 11. An outer contour of the ring structure of the gate electrode 20 may be square, and an inner contour of the ring structure of the gate electrode 20 may be circular, as shown in FIG. 11, and in practical applications, the outer contour and the inner contour of the ring structure of the gate electrode 20 may also have other shapes, for example, in a case where the top view of the first part of the source electrode 60 is elliptical, the inner contour of the ring structure of the gate electrode 20 may be correspondingly adjusted to be elliptical, a shape of the region surrounded by the ring structure of the gate electrode 20 and a shape of the top view of the first part of the source electrode 60 are not limited in the embodiment.

Figure 12:
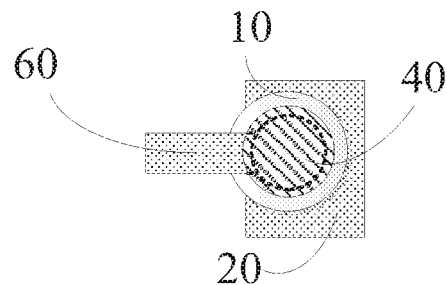
FIG. 12 shows a top view of a structure in which an active layer is formed above the source electrode in an embodiment of the present disclosure.

FIG. 12 shows a top view of a structure in which an active layer is formed above the source electrode in the embodiment. As shown in FIG. 12, similar to that shown in FIGS. 1 through 10, an orthographic projection of an active layer 40 on the substrate 10 covers an orthographic projection of the first part of the source electrode 60 on the substrate 10. In some implementations, the active layer 40 fully covers the first part of the source electrode 60, and further covers a portion of the substrate 10 exposed between the ring structure of the gate electrode 20 and the first part of the source electrode 60, thereby the active layer 40 covers an upper surface (i.e., a surface away from the substrate 10) of the first part of the source electrode 60, and further covers a side surface (i.e., a surface intersecting the upper surface) of the first part of the source electrode 60, in such way, a contact area between the active layer 40 and the source electrode 60 is increased, a potential drop between the source electrode 60 and the active layer 40 is reduced, which is helpful to carrier transport in the active layer 40.

After forming the active layer 40, a first insulation layer covering the gate electrode 20, the source electrode 60, the active layer 40, a portion of the substrate 10 exposed between the gate electrode 20 and the active layer 40 and another portion of the substrate 10 exposed between the gate electrode 20 and the source electrode 60 may be formed. Since the active layer 40 would be connected to a drain electrode to be formed subsequently, a via-hole may be provided in a region of the first insulation layer corresponding to the active layer 40, and the drain electrode can be connected to the active layer 40 through the via-hole in the first insulation layer.

Figure 13:
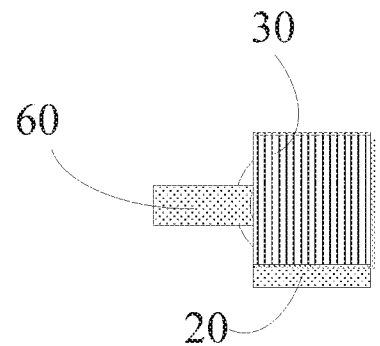
FIG. 13 shows a top view of a thin film transistor in which a drain electrode is formed on a first insulation layer in an embodiment of the present disclosure.

FIG. 13 shows a top view of a thin film transistor in which a drain electrode is formed on a first insulation layer in the embodiment. As shown in FIG. 13, an orthographic projection of a drain electrode 30 on the substrate 10 at least partially covers the orthographic projection of the active layer 40 on the substrate 10, and the drain electrode 30 may be connected to the active layer 40 through the via-hole in the first insulation layer.

In practical applications, an orthographic projection of the drain electrode 30 on the substrate 10 may at least partially cover the orthographic projection of the source electrode 60 on the substrate 10, that is, the source electrode 60 and the drain electrode 30 may have facing areas in a stacking direction in which the source electrode 60 and the drain electrode 30 are stacked, thus a length of a channel between the source electrode 60 and the drain electrode 30 may be a thickness of the active layer 40 between the source electrode 60 and the drain electrode 30 in the stacking direction. Certainly, in practical applications, the orthographic projection of the drain electrode 30 on the substrate 10 and the orthographic projection of the source electrode 60 on the substrate 10 may have no overlapped portions, that is, the source electrode 60 and the drain electrode 30 may have no facing areas in the stacking direction, with respect to the thin film transistor in which the source electrode 60 and the drain electrode 30 have no facing areas in the stacking direction, the length of the channel between the source electrode 60 and the drain electrode 30 is only slightly greater than that of the thin film transistor in which the source electrode 60 and the drain electrode 30 have facing areas in the stacking direction, but is still less than that of the thin film transistor of related technology in which the source electrode and the drain electrode are provided in a single layer.

It should be noted that, in order to illustrate a positional relationship between the drain electrode 30 and other structures clearly, the first insulation layer is not shown in FIG. 13, and the present disclosure is not limited by the structure shown in FIG. 13.

Figure 14:
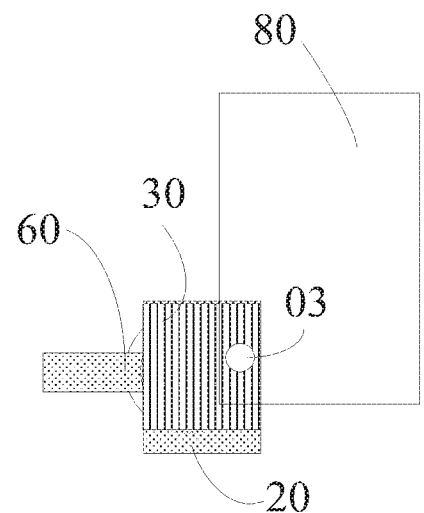
FIG. 14 shows a top view of a pixel structure in which a second insulation layer and a pixel electrode layer are formed on the thin film transistor in an embodiment of the present disclosure.

FIG. 14 shows a top view of a pixel structure in which a second insulation layer and a pixel electrode layer are formed on the thin film transistor in the embodiment. As shown in FIG. 14, a third via-hole 03 is provided at a position of the second insulation layer corresponding to the drain electrode 30. After forming the second insulation layer, a pixel electrode layer 80 may further be formed, the pixel electrode layer 80 covers the second insulation layer, and in some implementations, the pixel electrode layer 80 may cover a portion of the second insulation layer corresponding to a pixel display region, that is, the pixel electrode layer 80 is formed above the portion of the second insulation layer corresponding to the pixel display region, and the pixel electrode layer 80 may be connected to the drain electrode 30 through the third via-hole 03.

Figure 15:
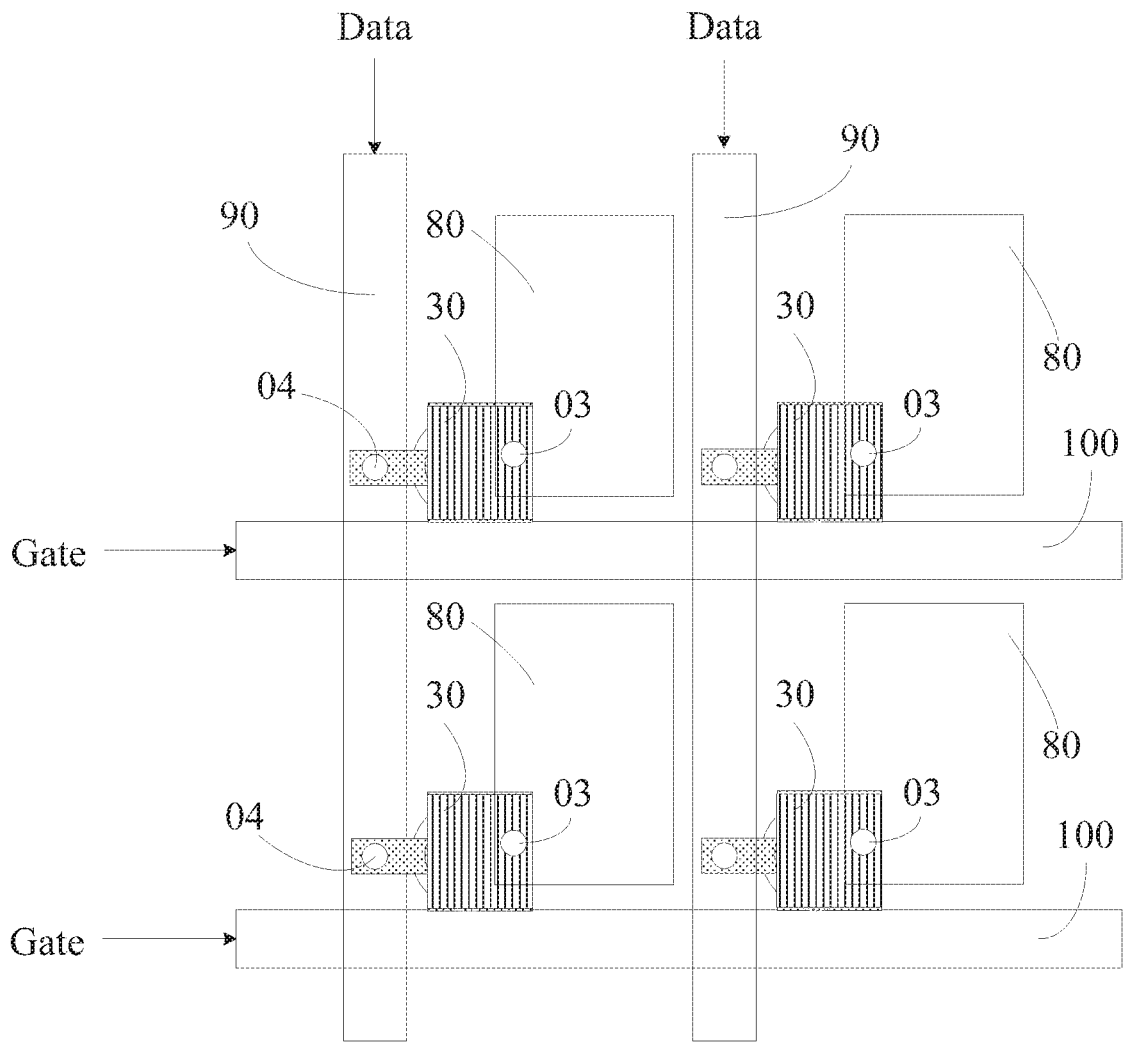
FIG. 15 shows a diagram of connections between a plurality of thin film transistors and a gate line, a data line in an embodiment of the present disclosure.

Further, in the thin film transistor of the embodiment, the first electrode is the source electrode, the second electrode is the drain electrode, and the source electrode and the gate electrode are formed in a single layer. In a display panel including the thin film transistor of the embodiment, source electrodes of thin film transistors in a single column would be connected together for driving pixels in column. FIG. 15 shows a diagram of connections between a plurality of thin film transistors and gate lines, data lines in the embodiment. As shown in FIG. 15, the display panel including the thin film transistor of the embodiment may further include a source electrode connection layer 90, source electrodes 60 of thin film transistors in a single column may connected together through the source electrode connection layer 90, and during a practical manufacturing procedure, the source electrode connection layer 90 may be provided in a layer the same as that in which the drain electrode 30 of the thin film transistor or the pixel electrode layer 80 is provided, and an orthographic projection of the source electrode connection layer 90 on the substrate 10 partially covers the second part of the source electrode 60 of each of the thin film transistors in the single column, that is, second parts of the source electrodes 60 of the thin film transistors in the single column may be connected together through the source electrode connection layer 90.

As shown in FIG. 15, in the display panel including the thin film transistor of the embodiment, the gate line 100 may be connected to the gate electrode 20 of the thin film transistor, and during displaying, a gate scanning signal Gate may be input to the gate line 100 to control on/off of the thin film transistor. The source electrode connection layer 90 may be used as a data line, and during displaying, a data signal Data may be input to the source electrode connection layer 90 to input the data signal Data to the source electrode 60 of the thin film transistor, so as to control displaying of a pixel. In some implementations, each gate line 100 may extend to thin film transistors in a single row, be connected to gate electrodes 20 of the thin film transistors in the single row and input the gate scanning signal Gate to the gate electrodes 20 of the thin film transistors in the single row simultaneously, to drive the thin film transistors in an entire row. Additionally, as shown in FIG. 15, the source electrode connection layer 90 may extend to thin film transistors in a same column as that of the thin film transistor, to be used as the data line for driving the thin film transistors in an entire column, and during displaying, the data signal Data may be input to the source electrode connection layer 90 to drive pixels in column and control displaying of the pixels. It should be noted that, FIG. 15 only shows an example of a connection relationship between four thin film transistors and the gate line, the data line, but the present disclosure is not limited thereto.

In practical applications, the source electrode connection layer 90 may include a material of metal or indium tin oxide (ITO), and since a conductivity of metal is better than that of ITO, the source electrode connection layer 90 may be formed of the material of metal.

In a traditional thin film transistor, a drain electrode and a source electrode are formed in a single layer, and since an accuracy of an exposure equipment is relatively low, a distance between the source electrode and the drain electrode generally equals to about 3 µm, and it is difficult to reduce the distance between the source electrode and the drain electrode, by contrast, in the thin film transistor of the embodiment, the drain electrode and the source electrode may be located in different layers, and the active layer may be located between the drain electrode and the source electrode, correspondingly, the length of the channel of the thin film transistor is the thickness of the active layer between the source electrode and the drain electrode, since a precision for controlling the thickness of the active layer is high in technology, the thickness of the active layer may be controlled below 1 μm, in the thin film transistor of the embodiment, the length of the channel is reduced significantly, an impedance during carrier transporting can be reduced, and a driving ability of the thin film transistor is improved.

Further, in the thin film transistor of the embodiment, the gate electrode has the ring structure, a portion of the source electrode may be located in the region surrounded by the ring structure of the gate electrode, and the active layer may cover the side surface of the source electrode along the region surrounded by the ring structure of the gate electrode, thereby the contact area between the active layer and the source electrode is increased, the potential drop between the source electrode and the active layer is reduced, which is helpful to carrier transport in the active layer. In addition, the ring structure of the gate electrode is helpful to a directional drive of excited electrons in the active layer under an influence of a magnetic field, thereby a driving ability of the gate electrode can be improved and a density of carriers in the active layer can be improved.

Furthermore, in the thin film transistor of the embodiment, the active layer is sandwiched between the source electrode and the drain electrode, it is avoided to expose the active layer in ambient light, thereby a shift of threshold voltage of the thin film transistor caused by a light-induced degradation of the active layer can be avoided, and a stability of the active layer is correspondingly improved.

Moreover, a second insulation layer and a pixel electrode layer may be provided above the thin film transistor of the embodiment to form a pixel structure. The second insulation layer may cover the first insulation layer and the drain electrode, and an orthographic projection of the second insulation layer on the substrate may partially cover the orthographic projection of the drain electrode on the substrate. As shown in FIG. 14, the third via-hole 03 is provided at the position of the second insulation layer corresponding to the drain electrode 30. After forming the second insulation layer, the pixel electrode layer 80 may further be formed, the pixel electrode layer 80 covers the second insulation layer, and in some implementations, the pixel electrode layer 80 may cover the portion of the second insulation layer corresponding to the pixel display region, that is, the pixel electrode layer 80 is formed above the portion of the second insulation layer corresponding to the pixel display region, and the pixel electrode layer 80 may be connected to the drain electrode 30 through the third via-hole 03.

It should be noted that, in order to illustrate a positional relationship between the pixel electrode layer 80 and other structures clearly, the second insulation layer is not shown in FIG. 14, and the present disclosure is not limited by the structure shown in FIG. 14.

It should be noted that, differences (e.g., positions of the source electrode and the drain electrode, the source electrode connection layer is required in a case where the source electrode and the gate electrode are formed in a single layer, specific structures of the source electrode and the drain electrode, etc.) from the embodiment shown in FIGS. 1 through 10 are mainly described in this embodiment, other related structures, materials, etc. of the thin film transistor of this embodiment are similar to or the same as those in the embodiment shown in FIGS. 1 through 10, thus are not repeated here.

The thin film transistor of the embodiment may include a substrate, a gate electrode and a first electrode provided in a single layer on the substrate, an active layer formed above the first electrode, a first insulation layer and a second electrode formed on the first insulation layer, an orthographic projection of the active layer on the substrate at least partially covers an orthographic projection of the first electrode on the substrate, the first insulation layer covers the gate electrode, the first electrode, the active layer, a portion of the substrate exposed between the gate electrode and the active layer and another portion of the substrate exposed between the gate electrode and the first electrode, an orthographic projection of the second electrode on the substrate at least partially covers the orthographic projection of the active layer on the substrate, and the second electrode is connected to the active layer through a via-hole in the first insulation layer. In the thin film transistor of the embodiment, the first electrode and the second electrode may be located in different layers, and the active layer may be located between the first electrode and the second electrode, correspondingly, the length of the channel of the thin film transistor equals to the thickness of the active layer between the first electrode and the second electrode, since a precision for controlling the thickness of the active layer is high in technology, the length of the channel of the thin film transistor can be reduced, thereby an impedance during carrier transporting is reduced, and a driving ability of the thin film transistor is improved.

Figure 16:
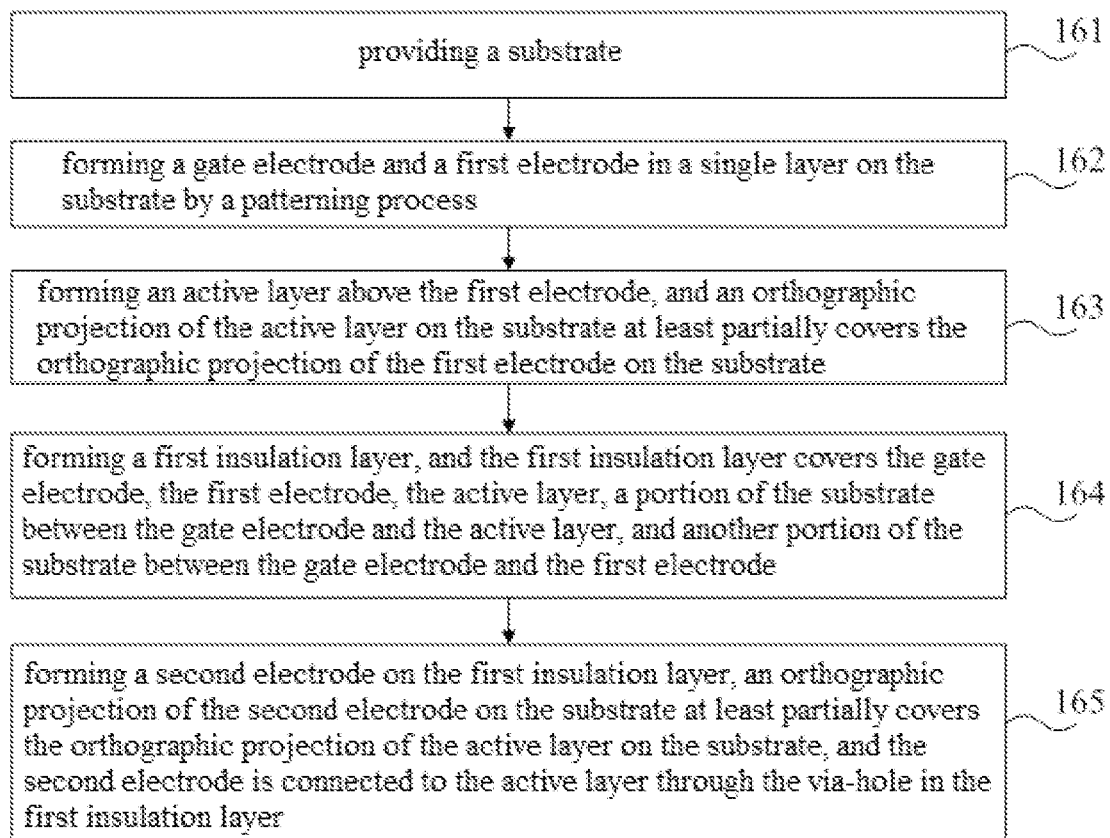
FIG. 16 shows a flow chart of a method for manufacturing a thin film transistor in an embodiment of the present disclosure.

FIG. 16 shows a flow chart of a method for manufacturing a thin film transistor in an embodiment of the present disclosure. As shown in FIG. 16, the method may include following steps 161 through 165.

At step 161, a substrate is provided.

In the embodiment, the substrate may be a planner glass substrate.

At step 162, a gate electrode and a first electrode are formed in a single layer on the substrate by a patterning process.

In the embodiment, the gate electrode may be an electrode of metal (such as aluminium and aluminium-copper alloy) with a good conductivity, function as a control terminal of the thin film transistor and control on/off of the thin film transistor according to a gate scanning signal Gate. The first electrode may be a source electrode or a drain electrode, and in practical applications, the first electrode may be a metal electrode.

First, at least one metal film layer may be formed on the substrate, and then the gate electrode and the first electrode of metal may be formed in a single layer on the substrate by a patterning process, the metal film layer generally may be formed by depositing, coating, sputtering and so on, and the patterning process generally may include photoresist coating, exposure, development, etching, photoresist stripping and so on.

In some implementations, the step 162 may include following sub-steps 1621 and 1622.

At sub-step 1621, a metal layer is formed on the substrate.

At this step, a first metal film layer and a second metal film layer may be formed on the substrate, the first metal film layer is provided closer to the substrate than the second metal film layer, and the second metal film layer is provided at a side of the first metal film layer away from the substrate. In practical applications, the first metal film layer may be an aluminum film layer, and the second metal film layer may be a copper film layer.

At sub-step 1622, the metal layer is patterned by a semi-mask process, to form the gate electrode and the first electrode, a thickness of the first electrode in a stacking direction in which the gate electrode and the first electrode are stacked is less than a thickness of the gate electrode in the stacking direction, and a difference between the thickness of the gate electrode and the thickness of the first electrode is less than a first threshold.

At this step, the metal layer is first etched by a first etching liquid capable of etching both the first metal film layer and the second metal film layer to form the gate electrode and a first electrode pattern, that is, the metal layer in a region in which the gate electrode and the first electrode pattern would not be formed is etched off by the first etching liquid, so as to form the gate electrode and the first electrode pattern. Since the first etching liquid can etch both the first metal film layer and the second metal film layer off, by etching using the first etching liquid, two metal film layers in the region in which the gate electrode and the first electrode pattern would not be formed are all etched off. Then, the first electrode pattern is etched by a second etching liquid capable of etching the second metal film layer, to form the first electrode. Since the second etching liquid only can etch off the second metal film layer but cannot etch off the first metal film layer, after etching the second metal film layer of the first electrode pattern off by the second etching liquid, the first electrode including the first metal film layer can be obtained.

For example, the first metal film layer is an aluminum film layer, the second metal film layer is a copper film layer, the metal layer may be first wet-etched by an aluminum-copper etching liquid (e.g. sulfuric acid), to form the gate electrode including the first metal film layer and the second metal film layer stacked together, and the first electrode pattern including the first metal film layer and the second metal film layer stacked together, and then, the metal layer may be wet-etched by a copper etching liquid to form the first electrode only including the first metal film layer, thus a difference between the thickness of the gate electrode and the thickness of the first electrode equals to a thickness of one metal film layer, thereby after subsequent film layers are formed, a difference between a thickness at a position of the gate electrode and a thickness at a position of the first electrode is reduced, an uniformity of thickness of an array substrate including the thin film transistor of the embodiment can be improved, avoiding a problem of rubbing mura during displaying of a display panel including the array substrate.

In addition, at step 162, a gate electrode having a ring structure and a first electrode at least partially located in a region surrounded by the ring structure of the gate electrode may be formed on the substrate by a patterning process. In some implementations, a gate electrode having a ring structure with an opening and a first electrode including a first part and a second part may be formed on the substrate by a patterning process, the first part of the first electrode may be located in the region surrounded by the ring structure of the gate electrode, the second part of the first electrode may be connected to the first part of the first electrode and extend to outside of the ring structure of the gate electrode through the opening of the ring structure of the gate electrode. In a case where the first electrode is the drain electrode, the second part of the first electrode may be connected to a pixel electrode layer subsequently, and in a case where the first electrode is the source electrode, the second part of the first electrode may be connected to source electrodes of other thin film transistors in a same column as that of the thin film transistor of the embodiment.

At step 163, an active layer is formed above the first electrode, and an orthographic projection of the active layer on the substrate at least partially covers the orthographic projection of the first electrode on the substrate.

In the embodiment, the active layer may be formed above the first electrode by depositing, coating, sputtering and so on, and the orthographic projection of the active layer on the substrate at least partially covers the orthographic projection of the first electrode on the substrate. In some implementations, the orthographic projection of the active layer on the substrate at least partially covers the orthographic projection of the first part of the first electrode on the substrate. In practical applications, the active layer may be formed of a semiconductor material, and the active layer may be conductive or not conductive according to the gate scanning signal Gate received by the gate electrode of the thin film transistor, so as to achieve on/off of the thin film transistor.

At step 164, a first insulation layer is formed, and the first insulation layer covers the gate electrode, the first electrode, the active layer, a portion of the substrate between the gate electrode and the active layer, and another portion of the substrate between the gate electrode and the first electrode.

In the embodiment, the first insulation layer may be formed to cover the gate electrode, the first electrode, the active layer, a portion of the substrate between the gate electrode and the active layer, and another portion of the substrate between the gate electrode and the first electrode, and the first insulation layer generally may be a SiNx film layer. After forming the first insulation layer, a via-hole may be formed at a position of the first insulation layer corresponding to the active layer, thus the active layer can be connected to a second electrode to be formed subsequently through the via-hole.

At step 165, a second electrode is formed on the first insulation layer, an orthographic projection of the second electrode on the substrate at least partially covers the orthographic projection of the active layer on the substrate, and the second electrode is connected to the active layer through the via-hole in the first insulation layer.

In the embodiment, in a case where the first electrode is the drain electrode, the second electrode is the source electrode, and in a case where the first electrode is the source electrode, the second electrode is the drain electrode. In practical application, the second electrode may be a metal electrode. The orthographic projection of the second electrode on the substrate at least partially covers the orthographic projection of the active layer on the substrate, thus the active layer can be sandwiched between the first electrode and the second electrode.

Further, in the embodiment, after forming the second electrode and completing the manufacturing of the thin film transistor, a second insulation layer and a pixel electrode layer may be further formed above the thin film transistor to form a pixel structure. In some implementations, after forming the second electrode, the second insulation layer may be formed, and the second insulation layer covers the first insulation layer and the second electrode. In a case where the first electrode is the drain electrode, and the second electrode is the source electrode, the orthographic projection of the second insulation layer on the substrate may cover the orthographic projection of the second part of the first electrode on the substrate. Since the pixel electrode layer to be formed subsequently would be connected to the drain electrode below the second insulation layer, in a case where the first electrode is the drain electrode, a via-hole may be formed at a position of the second insulation layer corresponding to the second part of the first electrode, thereby the pixel electrode layer to be formed subsequently can be connected to the first electrode (i.e., the drain electrode) through the via-hole in the second insulation layer. In a case where the first electrode is the source electrode and the second electrode is the drain electrode, a via-hole may be formed at a position of the second insulation layer corresponding to the second electrode, thereby the pixel electrode layer to be formed subsequently can be connected to the second electrode (i.e., the drain electrode) through the via-hole in the second insulation layer.

After forming the second insulation layer, the pixel electrode layer may be formed on the second insulation layer. In a case where the first electrode is the drain electrode, the pixel electrode layer may be connected to the second part of the first electrode through the via-hole in the second insulation layer. In a case where the second electrode is the drain electrode, the pixel electrode layer may be connected to the second electrode through the via-hole in the second insulation layer.

In some implementations, in the thin film transistor manufactured by the method of the embodiment, the first electrode is the source electrode and the second electrode is the drain electrode, the source electrode and the gate electrode are formed in a single layer, and in a display panel including the thin film transistor manufactured by the method of the embodiment, source electrodes of thin film transistors in an entire column are connected together for driving pixels in column, in a case where the first electrode is the source electrode and the second electrode is the drain electrode, in the method for manufacturing the display panel including the thin film transistor manufactured by the method of the embodiment, a source electrode connection layer is further required to be formed to connect the source electrodes of the thin film transistors in a single column. An orthographic projection of the source electrode connection layer on the substrate partially covers the second part of the source electrode of each of the thin film transistors in the single column.

In some implementations, the source electrode connection layer may be provided in a same layer as that of the second electrode of the thin film transistor, and the source electrode connection layer may include a material the same as that of the second electrode of the thin film transistor, for example, may include a metal material. Certainly, in practical applications, the source electrode connection layer may also be provided in a same layer as that of the pixel electrode layer, and the source electrode connection layer may include a material the same as that of the pixel electrode layer, for example, may include a material of ITO.

In a case where the source electrode connection layer is provided in a same layer as that of the second electrode of the thin film transistor, forming the second electrode on the first insulation layer includes: forming the second electrode and the source electrode connection layer in a single layer on the first insulation layer, and source electrodes of thin film transistors in a single column are connected through the source electrode connection layer. In a case where the source electrode connection layer is provided in a same layer as that of the pixel electrode layer, after forming the second electrode on the first insulation layer, the second insulation layer is formed, and after forming the second insulation layer, the method may further include: forming the pixel electrode layer and the source electrode connection layer in a single layer, and source electrodes of thin film transistors in a single column are connected through the source electrode connection layer.

In a traditional thin film transistor, a drain electrode and a source electrode are formed in a single layer, and since an accuracy of an exposure equipment is relatively low, a distance between the source electrode and the drain electrode generally equals to about 3 μm, and it is difficult to reduce the distance between the source electrode and the drain electrode, by contrast, in the method for manufacturing a thin film transistor of the embodiment, the drain electrode and the source electrode may be formed in different layers, and the active layer may be formed between the drain electrode and the source electrode, correspondingly, the length of the channel of the thin film transistor is the thickness of the active layer between the source electrode and the drain electrode, since a precision for controlling the thickness of the active layer is high in technology, the thickness of the active layer may be controlled below 1 μm, thus in the thin film transistor manufactured by the method of the embodiment, the length of the channel is reduced significantly, an impedance during carrier transporting can be reduced, and a driving ability of the thin film transistor is improved.

Further, in the thin film transistor manufactured by the method of the embodiment, the gate electrode has the ring structure, a portion of the first electrode may be located in the region surrounded by the ring structure of the gate electrode, and the active layer may cover the side surface of the first electrode along the region surrounded by the ring structure of the gate electrode, thereby the contact area between the active layer and the first electrode is increased, the potential drop between the first electrode and the active layer is reduced, which is helpful to carrier transport in the active layer. In addition, the ring structure of the gate electrode is helpful to a directional drive of excited electrons in the active layer under an influence of a magnetic field, thereby a driving ability of the gate electrode can be improved and a density of carriers in the active layer can be improved.

Furthermore, in the thin film transistor manufactured by the method of the embodiment, the active layer is sandwiched between the source electrode and the drain electrode, it is avoided to expose the active layer in ambient light, thereby a shift of threshold voltage of the thin film transistor caused by a light-induced degradation of the active layer can be avoided, and a stability of the active layer is correspondingly improved.

The method for manufacturing the thin film transistor of the embodiment may provide a substrate, a gate electrode and a first electrode may be formed in a single layer on the substrate by a patterning process, an active layer is formed above the first electrode, an orthographic projection of the active layer on the substrate at least partially covers an orthographic projection of the first electrode on the substrate, a first insulation layer is then formed, the first insulation layer covers the gate electrode, the first electrode, the active layer, a portion of the substrate exposed between the gate electrode and the active layer and another portion of the substrate exposed between the gate electrode and the first electrode, and a second electrode is further formed on the first insulation layer, an orthographic projection of the second electrode on the substrate at least partially covers the orthographic projection of the active layer on the substrate, and the second electrode is connected to the active layer through a via-hole in the first insulation layer. In the method for manufacturing the thin film transistor of the embodiment, the first electrode and the second electrode may be formed in different layers, and the active layer may be formed between the first electrode and the second electrode, correspondingly, the length of the channel of the thin film transistor equals to the thickness of the active layer between the first electrode and the second electrode, since a precision for controlling the thickness of the active layer is high in technology, the length of the channel of the thin film transistor can be reduced, thereby an impedance during carrier transporting is reduced, and a driving ability of the thin film transistor is improved.

An embodiment of the present disclosure further provides a display panel including the thin film transistor as above.

An embodiment of the present disclosure further provides a display device including the display panel as above.

For describing simply and clearly, for descriptions of methods of embodiments as above, each of the methods is indicated by a combination of a series of actions, but it should be understood that, the present disclosure is not limited to the described sequence of the actions, and according to technical solutions of the present disclosure, some of the steps (actions) may be executed in another sequence or simultaneously. It also should be understood that, the embodiments described are only examples, and the related actions and structures may be not necessary for the technical solutions of the present disclosure.

Some embodiments described only highlight differences between them and other embodiments, and the same or similar parts among the embodiments may be consulted with each other.

It also should be noted that, terms such as "first", "second" or the like are only used for distinguishing an entity or operation from another entity or operation, it does not necessarily require or imply any actual relationship or order between these entities or operations. Moreover, terms such as "include", "comprise" or any other variant thereof are non-exclusive, so that a method or product including a series of elements may include not only elements listed, but also other elements not explicitly listed, or may further include elements inherent in the method or product.

Without any explicit restriction, elements limited by a statement "including . . . " do not exclude an existence of additional elements in the method or product including the elements listed.

It should be understood that, the "column" and "row" related in embodiments of the present application may be exchanged with each other.

It also should be understood that, the above exemplary embodiments are used for explaining principle of technical solutions of the present disclosure, but these exemplary embodiments are illustrated merely for helping understand the technical solutions and a core concept of the present disclosure. For an ordinary skilled person in the art, various modifications and variants may be made according to the concept of the present disclosure, thus contents of the above exemplary embodiments should not be construed as a limitation to the present disclosure.

The invention claimed is:

1. A thin film transistor, comprising:
a substrate;
a gate electrode and a first electrode being in a single layer on the substrate;
an active layer being above the first electrode, an orthographic projection of the active layer on the substrate at least partially covers an orthographic projection of the first electrode on the substrate;
a first insulation layer covering the gate electrode, the first electrode, the active layer, a portion of the substrate exposed between the gate electrode and the active layer, and another portion of the substrate exposed between the gate electrode and the first electrode; and
a second electrode being above the first insulation layer, an orthographic projection of the second electrode on the substrate at least partially covers the orthographic projection of the active layer on the substrate, and the second electrode is connected to the active layer through a via-hole in the first insulation layer,
wherein the orthographic projection of the second electrode on the substrate at least partially cover the orthographic projection of the first electrode on the substrate, a portion of the active layer between the first electrode and the second electrode is flat and functions as a channel of the thin film transistor, and a length of the channel equals to a thickness of the active layer between the first electrode and the second electrode in a direction perpendicular to the substrate.

2. The thin film transistor of claim 1, wherein a thickness of the first electrode in a direction perpendicular to the substrate is less than a thickness of the gate electrode in the direction perpendicular to the substrate, and a difference between the thickness of the gate electrode and the thickness of the first electrode is less than a first threshold.

3. The thin film transistor of claim 1, wherein the gate electrode comprises a first metal film layer and a second metal film layer stacked together, the first metal film layer is provided closer to the substrate than the second metal film layer, the second metal film layer is provide at a side of the first metal film layer away from the substrate, and the first electrode comprises the first metal film layer.

4. The thin film transistor of claim 1, wherein the gate electrode has a ring structure, and at least a portion of the first electrode is located in a region surrounded by the ring structure.

5. The thin film transistor of claim 4, wherein the ring structure has an opening, the first electrode comprises a first part and a second part, the first part of the first electrode is located in the region surrounded by the ring structure, the second part is connected to the first part and extends to outside of the ring structure through the opening, and the orthographic projection of the active layer on the substrate covers an orthographic projection of the first part of the first electrode on the substrate.

6. A display panel comprising a pixel structure, the pixel structure comprises the thin film transistor of claim 1.

7. The display panel of claim 6, wherein the gate electrode has a ring structure, the ring structure has an opening, the first electrode comprises a first part and a second part, the first part of the first electrode is located in the region surrounded by the ring structure, the second part is connected to the first part and extends to outside of the ring structure through the opening, and the orthographic projection of the active layer on the substrate covers an orthographic projection of the first part of the first electrode on the substrate, the first electrode is a drain electrode, the second electrode is a source electrode, and the pixel structure further comprises:
a second insulation layer covering the first insulation layer and the second electrode, an orthographic projection of the second insulation layer on the substrate covers an orthographic projection of the second part of the first electrode on the substrate; and
a pixel electrode layer covering the second insulation layer, the pixel electrode layer is connected to the second part of the first electrode through a via-hole in the second insulation layer.

8. The display panel of claim 6, wherein the first electrode is a source electrode, the second electrode is a drain electrode, and the pixel structure further comprises:
a second insulation layer covering the first insulation layer and the second electrode, an orthographic projection of the second insulation layer on the substrate covers an orthographic projection of the second electrode on the substrate; and a pixel electrode layer covering the second insulation layer, the second insulation layer is connected to the second electrode through a via-hole in the second insulation layer.

9. The display panel of claim 6, comprising a plurality of thin film transistors arranged in a single column, wherein the first electrode of each of the thin film transistors is a source electrode, the second electrode of each of the thin film transistors is the drain electrode, and the display panel further comprises:

a source electrode connection layer for connecting source electrodes of the thin film transistors in the single column, and the source electrode connection layer is provided in a layer the same as that in which the second electrode of each of the thin film transistors or a pixel electrode layer is provided.

10. A method for manufacturing a thin film transistor, comprising:

providing a substrate;

forming a gate electrode and a first electrode in a single layer on the substrate by a patterning process;

forming an active layer above the first electrode, an orthographic projection of the active layer on the substrate at least partially covers an orthographic projection of the first electrode on the substrate;

forming a first insulation layer covering the gate electrode, the first electrode, the active layer, a portion of the substrate exposed between the gate electrode and the active layer, and another portion of the substrate exposed between the gate electrode and the first electrode; and forming a second electrode on the first insulation layer, an orthographic projection of the second electrode on the substrate at least partially covers the orthographic projection of the active layer on the substrate, and the second electrode is connected to the active layer through a via-hole in the first insulation layer, wherein the orthographic projection of the second electrode on the substrate at least partially cover the orthographic projection of the first electrode on the substrate, a portion of the active layer between the first electrode and the second electrode is flat and functions as a channel of the thin film transistor, and a length of the channel equals to a thickness of the active layer between the first electrode and the second electrode in a direction perpendicular to the substrate.

11. The method of claim 10, wherein forming the gate electrode and the first electrode in the single layer on the substrate by the patterning process comprises:

forming a first metal film layer and a second metal film layer on the substrate, the first metal film layer is formed closer to the substrate than the second metal film layer, the second metal film layer is formed at a side of the first metal film layer away from the substrate;

etching the metal film layers by an etching liquid capable of etching both the first metal film layer and the second metal film layer to form the gate electrode and a first electrode pattern; and etching the first electrode pattern by an etching liquid capable of etching the second metal film layer to form the first electrode.

12. A method for manufacturing a display panel, comprising the method for forming the thin film transistor of claim 10.

13. The method of claim 12, wherein the gate electrode has a ring structure, the ring structure has an opening, the first electrode comprises a first part and a second part, the first part of the first electrode is located in the region surrounded by the ring structure, the second part is connected to the first part and extends to outside of the ring structure through the opening, and the orthographic projection of the active layer on the substrate covers an orthographic projection of the first part of the first electrode on the substrate, the first electrode is a drain electrode, the second electrode is a source electrode, and the method for manufacturing the display panel further comprises:

forming a second insulation layer on the first insulation layer and the second electrode, an orthographic projection of the second insulation layer on the substrate covers an orthographic projection of the second part of the first electrode on the substrate; and forming a pixel electrode layer on the second insulation layer, the pixel electrode layer is connected to the second part of the first electrode through a via-hole in the second insulation layer.

14. The method of claim 12, wherein the first electrode is a source electrode, the second electrode is a drain electrode, and the method for manufacturing the display panel further comprises:

forming a second insulation layer on the first insulation layer and the second electrode, an orthographic projection of the second insulation layer on the substrate covers the orthographic projection of the second electrode on the substrate; and forming a pixel electrode layer on the second insulation layer, and the pixel electrode layer is connected to the second electrode through a via-hole in the second insulation layer.

15. The method of claim 12, wherein the display panel further comprises a plurality of thin film transistors arranged in a single column, the first electrode of each of the thin film transistors is a source electrode, the second electrode of each of the thin film transistors is a drain electrode, and the method for manufacturing the display panel further comprises:

forming a source electrode connection layer in a layer the same as that in which the second electrode of each of the thin film transistors or a pixel electrode layer is provided, source electrodes of the thin film transistors in the single column are connected together through the source electrode connection layer.

* * * * *